United States Patent
Mi et al.

(10) Patent No.: US 10,891,886 B2
(45) Date of Patent: *Jan. 12, 2021

(54) SHIFT REGISTER, GATE LINE DRIVING METHOD, ARRAY SUBSTRATE AND DISPLAY DEVICE FOR HIGH AND LOW RESOLUTION AREAS

(71) Applicants: BOE Technology Group Co., Ltd., Beijing (CN); Beijing BOE Optoelectronics Technology Co., Ltd., Beijing (CN)

(72) Inventors: Lei Mi, Beijing (CN); Shijun Wang, Beijing (CN); Yanna Xue, Beijing (CN)

(73) Assignees: BOE TECHNOLOGY GROUP CO., LTD., Beijing (CN); BEIJING BOE OPTOELECTRONICS TECHNOLOGY CO., LTD., Beijing (CN)

( * ) Notice: Subject to any disclaimer, the term of this patent is extended or adjusted under 35 U.S.C. 154(b) by 0 days.

This patent is subject to a terminal disclaimer.

(21) Appl. No.: 15/758,554

(22) PCT Filed: Sep. 5, 2017

(86) PCT No.: PCT/CN2017/100604
§ 371 (c)(1),
(2) Date: Mar. 8, 2018

(87) PCT Pub. No.: WO2018/149116
PCT Pub. Date: Aug. 23, 2018

(65) Prior Publication Data
US 2020/0234621 A1    Jul. 23, 2020

(30) Foreign Application Priority Data
Feb. 17, 2017 (CN) .......................... 2017 1 0087283

(51) Int. Cl.
*G09G 3/20* (2006.01)
*G09G 3/3266* (2016.01)
(Continued)

(52) U.S. Cl.
CPC ............. *G09G 3/20* (2013.01); *G09G 3/3266* (2013.01); *G09G 3/3677* (2013.01);
(Continued)

(58) Field of Classification Search
CPC ...... G09G 3/3677; G09G 3/3266; G09G 3/20; G09G 2310/0286; G09G 2330/021; G09G 2340/0407; G11C 19/287; G11C 19/28
See application file for complete search history.

(56) References Cited

U.S. PATENT DOCUMENTS

2001/0005194 A1*  6/2001  Hiroki .................. G09G 3/3648
                                                                        345/99
2012/0056909 A1   3/2012  Shih et al.
(Continued)

FOREIGN PATENT DOCUMENTS

CN    104464667 A    3/2015
CN    104700798 A    6/2015
(Continued)

OTHER PUBLICATIONS

First Office Action of the prior Chinese application No. 201710087283.1 dated Feb. 27, 2019.
(Continued)

*Primary Examiner* — Darlene M Ritchie
(74) *Attorney, Agent, or Firm* — Fay Sharpe LLP

(57) ABSTRACT

A shift register, a gate line driving method, an array substrate and a display device are provided. The shift register includes a plurality of shift register s arranged in a one-to-one correspondence with gate lines on an array substrate; and a control circuit configured to control signals outputted from
(Continued)

the shift register s to the gate lines, to control each row of gate lines to be turned on and off, so that a display area has a high-resolution area and a low-resolution area. In the low-resolution area, the control circuit controls the gate lines to be turned on and off group by group. Each group of gate lines include at least two adjacent gate lines, and gate lines in the same group are turned on and off synchronously.

13 Claims, 3 Drawing Sheets

(51) Int. Cl.
*G09G 3/36* (2006.01)
*G11C 19/28* (2006.01)

(52) U.S. Cl.
CPC ... *G11C 19/287* (2013.01); *G09G 2310/0286* (2013.01); *G09G 2330/021* (2013.01); *G09G 2340/0407* (2013.01)

(56) References Cited

U.S. PATENT DOCUMENTS

| | | | | |
|---|---|---|---|---|
| 2012/0206510 A1* | 8/2012 | Furuta | ................. | G09G 3/3614 345/690 |
| 2015/0221273 A1 | 8/2015 | Lee et al. | | |
| 2016/0171938 A1* | 6/2016 | Na | ...................... | G09G 3/3688 345/698 |
| 2016/0267713 A1 | 9/2016 | Patel | | |
| 2016/0267715 A1 | 9/2016 | Patel | | |
| 2016/0267716 A1 | 9/2016 | Patel | | |
| 2017/0148420 A1 | 5/2017 | Gao et al. | | |
| 2017/0178557 A1 | 6/2017 | Li et al. | | |
| 2017/0200415 A1 | 7/2017 | Noguchi et al. | | |
| 2019/0172399 A1* | 6/2019 | Chen | ................... | G09G 3/3275 |

FOREIGN PATENT DOCUMENTS

| | | |
|---|---|---|
| CN | 104978944 A | 10/2015 |
| CN | 104992686 A | 10/2015 |
| CN | 105139792 A | 12/2015 |
| CN | 106157873 A | 11/2016 |
| CN | 106548745 A | 3/2017 |
| CN | 106663404 A | 5/2017 |
| CN | 106782278 A | 5/2017 |
| WO | WO2016009909 A1 | 1/2016 |
| WO | WO2017020526 A1 | 2/2017 |

OTHER PUBLICATIONS

International Search Report and Written Opinion for PCT Application PCT/CN2017/100604 dated Nov. 30, 2017.

* cited by examiner

SHIFT REGISTER, GATE LINE DRIVING METHOD, ARRAY SUBSTRATE AND DISPLAY DEVICE FOR HIGH AND LOW RESOLUTION AREAS

This application is a 371 of PCT Patent Application Ser. No. PCT/CN2017/100604 filed Sep. 5, 2017, which claims priority to Chinese Patent Application No. 201710087283.1, filed with the State Intellectual Property Office on Feb. 17, 2017 and titled "SHIFT REGISTER, GATE LINE DRIVING METHOD, ARRAY SUBSTRATE AND DISPLAY DEVICE," the entire contents of which are incorporated herein by reference.

TECHNICAL FIELD

The disclosure relates to the field of displays, and in particular, to a shift register, a gate line driving method, an array substrate and a display device.

BACKGROUND

When a display panel displays an image, a pixel unit needs to be scanned by a shift register (i.e., a gate drive circuit). The shift register includes a plurality of shift register circuits. Each of the shift register circuits corresponds to a row of pixel units. The plurality of shift register circuits scan and drive each row of pixel units in the display panel row by row (namely, in a progressive or non-interlace manner) to display the image.

As the resolution of the display panel increases, the number of rows of pixel units in the display panel also increases. For example, the number of rows of pixel units in a 4K display panel is 2160, and the number of rows of pixel units in a display panel of 8K reaches up to 4320. As the number of rows of pixel units in the display panel increases, the power consumption of the display panel rises sharply when the display panel performs scanning row by row. Therefore, power consumption undoubtedly becomes the primary problem to be solved in high-resolution display panels.

SUMMARY

The present disclosure provides a shift register, a gate line driving method, an array substrate and a display device. The technical solutions are as follows:

At least one embodiment of the present disclosure provides a shift register. The shift register includes:

a plurality of shift register circuits arranged in a one-to-one correspondence with gate lines on an array substrate; and a control circuit configured to control signals outputted from the shift register circuits to the gate lines, to control each row of gate lines to be turned on and off, so that a display area has a high-resolution area and a low-resolution area, where a resolution of the low-resolution area is smaller than that of the high-resolution area.

In the high-resolution area, the control circuit controls the gate lines to be turned on and off row by row; and in the low-resolution area, the control circuit controls the gate lines to be turned on and off group by group. Each group of gate lines include at least two adjacent gate lines, and gate lines in the same group are turned on and off synchronously.

In an implementation of the embodiments of the present disclosure, the plurality of shift register circuits are divided into a plurality of groups. Each group of shift register circuits are arranged to correspond to at least two consecutive gate lines and each group of shift register circuits comprise a first shift register circuit and at least one second shift register circuit. The first shift register circuit is directly connected to a corresponding gate line, and the second shift register circuit is connected to a corresponding gate line through the control circuit.

In some embodiments, each group of shift register circuits may comprise one first shift register circuit and one second shift register circuit. Or, each group of shift register circuits may comprise one first shift register circuit and two second shift register circuits.

In some embodiments, each group of shift register circuits have the same number of shift register circuits and each group of the first control switches have the same number of first control switches.

In an implementation of the embodiments of the present disclosure, the control circuit includes a plurality of groups of first control switches and a plurality of second control switches. Each group of first control switches comprise at least one control switch and gate lines corresponding to each group of shift register circuits are connected successively using one group of the first control switches. Each second shift register circuit is connected to the corresponding gate line through one second control switch. The first control switch is configured to be switched off when the gate line corresponding thereto is located in the high-resolution area and scanned, and switched on when the gate line corresponding thereto is located in the low-resolution area and scanned. The second control switch is configured to be switched on when the gate line corresponding thereto is located in the high-resolution area and scanned.

In another implementation of the embodiments of the present disclosure, when two consecutive areas in a direction of scanning data line are sequentially the low-resolution area and the high-resolution area, the second control switch is configured to be switched off when a first gate line in the low-resolution area is scanned, and switched on when a second gate line in the low-resolution area is scanned, and a next stage of shift register circuit of the second shift register circuit corresponding to the second gate line is a second shift register circuit corresponding to a gate line in the high-resolution area, and the first gate line is a gate line in the low-resolution area other than the second gate line.

In another implementation of the embodiments of the present disclosure, the first control switch is configured to be switched off when the gate line in the high-resolution area is scanned, and switched on when the gate line in the low-resolution area is scanned. The second control switch is configured to be switched on when the gate line in the high-resolution area is scanned.

In another implementation of the embodiments of the present disclosure, the shift register further includes a first control line and a second control line. The first control line is connected to control terminals of the plurality of groups of first control switches, and the second control line is connected to control terminals of the plurality of second control switches.

In some embodiments, the first control line and the second control line extend in the same direction as the direction of scanning data line.

In another implementation of the embodiments of the present disclosure, the first shift register circuit and the second shift register circuit are disposed on both sides of the display area.

In another implementation of the embodiments of the present disclosure, all of the first control switch is connected to one end of the corresponding gate line close to the first shift register circuit.

In another implementation of the embodiments of the present disclosure, all of the second control switches are connected to one end of the corresponding gate line close to the second shift register circuit.

In yet another implementation of the embodiments of the present disclosure, the shift register further includes a clock signal line configured to output a low level signal to the second shift register circuit corresponding to the gate line in the low-resolution area when a gate line in the low-resolution area is scanned.

In an implementation of the embodiments of the present disclosure, in the direction of scanning data line, the turn-on periods of time for any two adjacent rows of gate lines partially overlap. In the direction of scanning data line, the turn-on periods of time for any two adjacent groups of gate lines partially overlap.

At least one embodiment of the present disclosure further provides a gate line driving method. The method is implemented by adopting the foregoing shift register. The method includes:

determining a high-resolution area and a low-resolution area of a display area; and in the high-resolution area, controlling gate lines to be turned on and off row by row; and in the low-resolution area, controlling gate lines to be turned on and off group by group, where each group of gate lines comprise at least two adjacent gate lines, and gate lines in the same group are turned on and off synchronously.

In an implementation of the embodiments of the present disclosure, the method further includes: outputting a low-level signal to a second shift register circuit corresponding to a gate line in the low-resolution area when the gate line in the low-resolution area is scanned, where the second shift register circuit is a shift register connected to the corresponding gate line through the control circuit among the plurality of shift register circuits.

At least one embodiment of the present disclosure further provides an array substrate that includes the shift register described above.

At least one embodiment of the present disclosure further provides a display device that includes the array substrate described above.

In some embodiments, the display device may further include a controller configured to control the control circuit described above. For example, the controller may control the control circuit by inputting control signals to the first and the second control signal lines.

BRIEF DESCRIPTION OF THE DRAWINGS

To describe the technical solutions in the embodiments of the present disclosure more clearly, the following briefly introduces the accompanying drawings required for describing the embodiments. Apparently, the accompanying drawings in the following description show merely some embodiments of the present disclosure, and a person of ordinary skill in the art may still derive other drawings from these accompanying drawings without creative efforts.

DETAILED DESCRIPTION OF THE EMBODIMENTS

Figure 1:
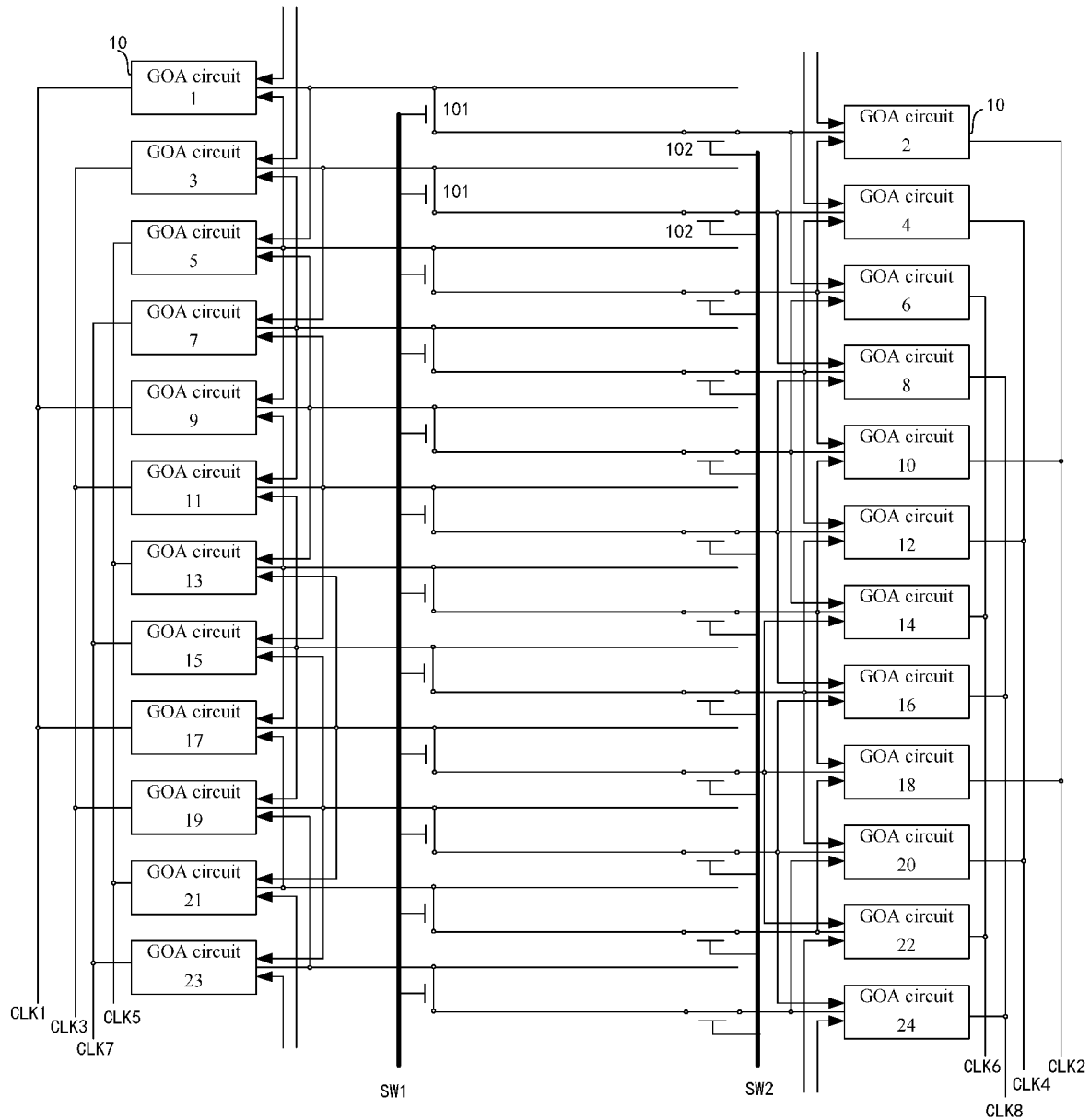
FIG. 1 is a structural schematic diagram of a shift register provided in an embodiment of the present disclosure.

The present disclosure will be described in further detail with reference to the enclosed drawings, to clearly present the objects, technique solutions, and advantages of the present disclosure.

The embodiments of the present disclosure provide a shift register. The shift register includes a plurality of shift register circuits arranged in a one-to-one correspondence with gate lines on an array substrate, and a control circuit. The control circuit is configured to control signals outputted from the shift register circuits to the gate lines so as to control each row of gate lines to be turned on and off so that a display area has a high-resolution area and a low-resolution area. The control circuit controls the gate lines to be turned on and off row by row in the high-resolution area. The control circuit controls at least two adjacent gate lines to be turned on and off in synchronism in the low-resolution area. In the embodiments of the present disclosure, the control circuit controls the gate lines to be turned on and off group by group in the low-resolution area. Each group of gate lines include at least two adjacent gate lines, and gate lines in the same group are turned on and off in synchronism.

Gate line turn-on refers to outputting a gate high level to a thin film transistor (TFT) of a pixel unit through a gate line, so that the source and drain of the TFT are turned on. Gate line turn-off refers to outputting a gate low level to the TFT of the pixel unit through the gate line, so that the source and drain of the TFT are turned off.

In the embodiments of the present disclosure, in the high-resolution area, the gate lines are controlled to be turned on and off row by row. In the low-resolution area, at least two adjacent gate lines are controlled to be turned on and off in synchronism. In this way, each gate line in the high-resolution area works independently to ensure high resolution. When the low-resolution area is displayed, at least two gate lines are scanned at the same time. A source driver writes the same data signal to the at least two gate lines to reduce changes in the data signal and decrease the power consumption of the source driver. Finally, the high-resolution display panel can be divided into a high-resolution area and a low-resolution area. The low power consumption of the low-resolution area reduces the overall power consumption of the display panel, and solves the problem that the power consumption in the existing high-resolution display panels increases dramatically due to the increase in the number of scanning rows.

It should be noted that the low resolution and high resolution in the present disclosure are relative. The low-resolution area refers to a lower-resolution area relative to the high-resolution area. In practice, the resolution in the low-resolution area may also reach the high definition (HD) standard. Therefore, the low-resolution area in the present disclosure may also be referred to as a high-resolution area and the high-resolution area may also be referred to as an ultra-high-resolution area, such as a Quad High Definition (QHD) area.

In the same frame, there may be at least one high-resolution area, and there may be also at least one low-resolution area. For example, the middle portion of the display panel is a high-resolution area and the upper portion and the lower portion of the display panel are low-resolution areas. As another example, the upper portion of the display panel is a low-resolution area and the lower portion of the display panel is a high-resolution area.

In a possible implementation, the control circuit includes a controller, a plurality of groups of first control switches, and a plurality of second control switches. Each group of first control switches include N first control switches, and N is a positive integer. Each group of first control switches are sequentially connected to N+1 adjacent gate lines. The gate lines connected to any two groups of first control switches are different. Each first control switch may connect two adjacent gate lines. Two first control switches may connect three adjacent gate lines. By analogy, N first control switches may connect adjacent N+1 gates lines. For example, the first one of the first control switches connects the first and second gate lines, the second one of the first control switches connects the second and third gate lines. By analogy, the Nth one of the first control switches connects the N and N+1 gate lines.

One of the N+1 gate lines connected to each group of first control switches is directly connected to one of the shift register circuits, and the other N gate lines are respectively connected to the other N shift register circuits through N second control switches.

Accordingly, N+1 shift registers corresponding to the N+1 gate lines connected to each group of first control switches belong to one group. That is, each group of shift registers correspond to one group of first control switches, and the gate lines corresponding to each group of shift register circuits are sequentially connected by one group of first control switches. Each group of shift register circuits include one first shift register circuit and N second shift register circuits. The first shift register circuit is directly connected to the corresponding gate line. The second shift register circuit is connected to the corresponding gate line through the control circuit (more accurately, the second control switch in the control circuit).

The first control switch is configured to be switched off when the corresponding gate line is located in the high-resolution area and scanned, and to be switched on when the corresponding gate line is located in the low-resolution area and scanned. The second control switch is configured to be switched on when the corresponding gate line is located in the high-resolution area and is scanned.

The controller is configured to control the first control switch connected to the gate line in the high-resolution area to be switched off and control the second control switch connected to the gate line in the high-resolution area to be switched on when the gate line in the high-resolution area is scanned. The controller is further configured to control the first control switch connected to the gate line in the low-resolution area to be switched on when the gate line in the low-resolution area is scanned. In practice, the controller may also be used as an external control device connected to the shift register, such as a control integrated circuit (IC) instead of being a part of the shift register.

In this embodiment, the number of shift register circuits in each group of shift register circuits is equal, and the number of switches in each group of first control switches is also equal to simplify the control logic.

In this implementation, adjacent N+1 gate lines are connected by a group of first control switches. One of the N+1 gate lines connected to each group of first control switches is directly connected to a shift register circuit. The remaining gate lines are connected to the shift register circuits via the second control switch. When a gate line in the high-resolution area is scanned, the first control switch connected to the gate line in the high-resolution area is controlled to be switched off and the second control switch is controlled to be switched on. Each gate line is connected to a shift register circuit, so that each gate line in the high-resolution area works independently to ensure high resolution. When a gate line in the low-resolution area is scanned, the first control switch connected to the gate line in the low-resolution area is controlled to be switched on. The N+1 gate lines in the low-resolution area are driven by the output of the same shift register circuit. In this case, some of the shift register circuits may be controlled not to output to reduce the power consumption of this area. At the same time, the N+1 gate lines are scanned simultaneously when the low-resolution area is displayed. The source driver writes the same data signal to the N+1 gate lines, reducing changes in the data signal and reducing the power consumption of the source driver. Finally, the high-resolution display panel may be divided into a high-resolution area and a low-resolution area. The low power consumption of the low-resolution area reduces the overall power consumption of the display panel and solves the problem that the power consumption in the existing high-resolution display panel increases dramatically due to the increase in the number of scanning rows.

In an embodiment of the present disclosure, the value of N may be 1 or 2, so that a group of first control switches may connect two or three gate lines and thus the two or three gate lines are turned on or turned off at the same time at a low resolution. Setting the value of N to 1 or 2, may achieve the resolution reduction on the one hand and ensure that the resolution is not too low at low resolution on the other hand.

In an embodiment of the present disclosure, the first control switch and the second control switch may be TFT switches, which may be fabricated together with the display panel, and the manufacturing is convenient.

In an embodiment of the present disclosure, the display panel may have two display modes, a first display mode and a second display mode. When the display panel adopts the first display mode (which may also be referred to as a low-power consumption display mode), the display area includes a low-resolution area. For example, the display area may be divided into a low-resolution area, a high-resolution area, and a low-resolution area disposed along a direction of scanning data line (i.e., the extension direction of the data line). The size and location of each area may be determined with the human eye tracking technology. For example, the area the user is viewing may be determined as a high-resolution area and the remaining area is set as a low-resolution area.

When the display panel adopts the second display mode (which may also be referred to as a normal mode), the entire display area is a high-resolution area. In the second display mode, each row of gate lines in the display area are turned on sequentially.

In an embodiment of the present disclosure, the display panel may further have a third type of display mode, which may be referred to as a third display mode (which may also be referred to as a low-resolution display mode). When the display panel adopts the third display mode, all the display area is a low-resolution area. In the third display mode, each row of gate lines in the display area are turned on group by group sequentially.

The structure of the control circuit described above will be described below with reference to FIG. 1. As shown in FIG. 1, each group of first control switches include one first control switch 101. The first control switch 101 is connected to two adjacent gate lines 100. One of the two gate lines 100 is directly connected to a gate on array (GOA) circuit 10 (i.e., a shift register circuit). The other of the two gate lines 100 is connected to the GOA circuit 10 through a second control switch 102. In the high-resolution area, the first control switch 101 is switched off and the second control switch 102 is switched on. Each GOA circuit 10 provides a drive signal for each row of gate lines. In the low-resolution area, the first control switch 101 is switched on and the second control switch 102 is switched off. One GOA circuit 10 provides a drive signal for two rows of gate lines so that the two rows of gate lines are turned on and off in synchronism.

As described above, in the embodiment of the present disclosure, the plurality of shift register circuits include a plurality of first shift register circuits and a plurality of second shift register circuits. The first shift register circuits and the second shift register circuits are arranged on two sides of the display area. Since frame areas on two sides of the existing display are usually arranged symmetrically, when the plurality of shift register circuits are arranged on the same side of the display area, the frame on the side where the shift register circuits are arranged needs to be made larger. Correspondingly, the frame on the opposite side will also be larger. Therefore, arranging the plurality of shift register circuits on two sides of the display area can prevent the frame of the display panel from being too large due to the arrangement of the plurality of shift register circuits on the same side. As shown in FIG. 1, the shift register circuit 10 disposed on the left in FIG. 1 is a first shift register circuit, and the shift register circuit 10 disposed on the right is a second shift register circuit.

The first shift register circuit is directly connected to the corresponding gate line, and the second shift register circuit is connected to the corresponding gate line through the second control switch.

Since the gate lines are turned on one by one or group by group along the data line scanning direction, only the operation of the first control switch and the second control switch connected to the gate line currently being scanned will affect the scanning of the gate line. The operation of the first control switch and the second control switch connected to other gate lines which are not currently scanned do not affect the scanning of the gate lines. Therefore, during implementation, all the first control switches 101 may operate at the same time. For example, all the first control switches 101 are switched on simultaneously or switched off simultaneously, so as to simplify the control logic of the first control switch. Similarly, the second control switches 102 may also operate at the same time. For example, the second control switches 102 are switched on simultaneously or switched off simultaneously to simplify the control logic of the second control switch.

In this embodiment, therefore, the first control switch 101 may be configured to be switched off when a gate line in the high-resolution area is scanned and be switched on when a gate line in the low-resolution area is scanned. The second control switch may be configured to be switched on when a gate line in the high-resolution area is scanned.

In the embodiment of the present disclosure, the shift register may further include a first control line and a second control line. The first control line is connected to the control terminals of the plurality of first control switches. The second control line is connected to the control terminals of the plurality of second control switches. Input terminals of the first control line and the second control line are electrically connected to the controller. As shown in FIG. 1, the first control line SW1 connects all the first control switches 101 and the second control line SW2 connects all the second control switches 102. By providing the first control line and the second control line, the control of the first control switch and the second control switch is convenient and the wiring is also convenient.

In the embodiment of the present disclosure, the controller is configured to, when the gate lines in the low-resolution area are scanned, control the clock signals that are outputted to the shift register circuits connected to the gate lines through the second control switches to be at a low level, thereby controlling these shift register circuits not to output so as to achieve low power consumption. Taking the structure shown in FIG. 1 as an example, in the low-resolution area, the controller controls the shift register circuits on the left side to output, and controls the shift register circuits on the right side not to output. At the same time, the controller is further configured to, when the gate lines in the low-resolution area are scanned, control the clock signals that are outputted to the shift register circuits directly connected to the gate lines to be square wave signals so as to control these shift register circuits to output.

It is easy to know that the controller usually needs to provide the clock signal to the shift register circuit through a clock signal line. Therefore, in the embodiment of the present disclosure, the shift register further includes a clock signal line that is configured to, when a gate line in the low-resolution area is scanned, output a low-level signal to the second shift register circuit corresponding to the gate line in the low-resolution area. At the same time, the clock signal line is further configured to, when a gate line in the low-resolution area is scanned, output a square wave signal to the first shift register circuit connected to the gate line in the low-resolution area. The clock signal line is further configured to, when a gate line in the high-resolution area is scanned, output a square wave signal to the first shift register circuit and the second shift register circuit corresponding to the gate line in the high-resolution area.

During implementation, the controller may provide one, two or more clock (CLK) signals, and one signal is input to a plurality of shift register circuits simultaneously. Correspondingly, one, two or more clock signal lines may also be provided, and each clock signal corresponds to one clock signal line. Taking FIG. 1 as an example, the clock signal can provide CLK1~CLK8 eight clock signals. CLK1 is outputted to GOA circuit 1, GOA circuit 9, GOA circuit 17 . . . . CLK2 is outputted to GOA circuit 2, GOA circuit 10, GOA circuit 18 . . . , . . . , CLK8 is outputted to GOA circuit 8, GOA circuit 16, GOA circuit 24 . . . . Of course, the aforementioned eight CLKs are only an example. In practice, there may be more or less number of CLKs, for example, 4 CLKs. In addition, the GOA circuit also needs to use a STV (Start Vertical) as a start signal to start scanning. A subsequent GOA circuit uses the output of a previous GOA circuit as an input to control its own output, which can be implemented in cascade. Taking FIG. 1 as an example, the shift register provides four STVs that are input to GOA circuits 1, 2, 3 and 4 respectively. GOA circuit 1, GOA circuit 5, GOA circuit 9, GOA circuit 13, GOA circuit 17, and GOA circuit 21 are cascaded. Taking GOA circuit 5 as an example, GOA circuit 5 uses the output of GOA circuit 1 as its input signal and GOA circuit 9 provides a reset signal thereto. GOA circuit 2, GOA circuit 6, GOA circuit 10, GOA circuit 14, GOA circuit 18, and GOA circuit 22 are cascaded. GOA circuit 3, GOA circuit 7, GOA circuit 11, GOA circuit 15, GOA circuit 19, and GOA circuit 23 are cascaded. GOA circuit 4, GOA circuit 8, GOA circuit 12, GOA circuit 16, GOA circuit 20, and GOA circuit 24 are cascaded.

The first control switch, the second control switch, and the clock signal will be described hereinafter with reference to the timing control diagrams shown in FIG. 2 and FIG. 3.

Figure 2:
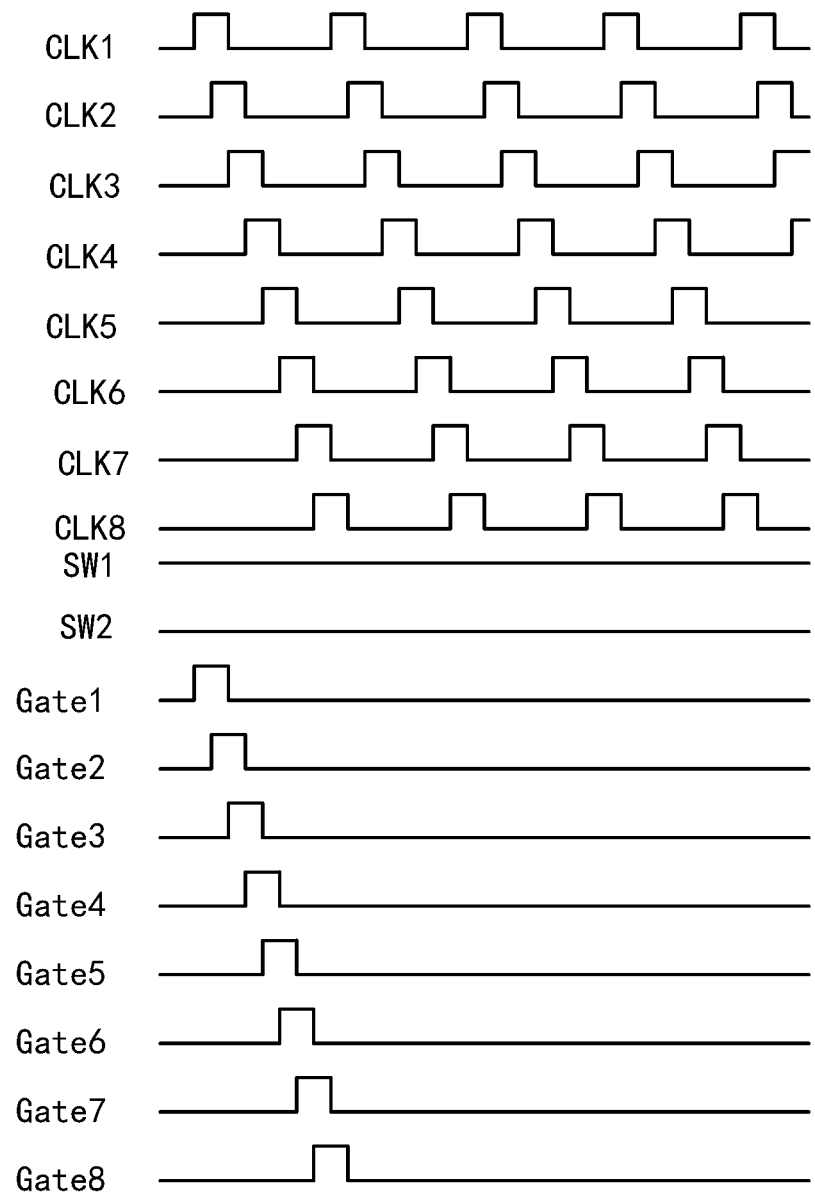
FIG. 2 is a timing control diagram provided in an embodiment of the present disclosure.

FIG. 2 is a timing control diagram in the second display mode. CLK1~CLK8 are timing signals input to GOA circuit 1~GOA circuit 8 shown in FIG. 1. There is phase differences among CLK1~CLK8, so as to ensure that each row of gate lines are turned on successively. Gate1 to Gate8 are the output of the first to eighth gate lines shown in FIG. 1. The first to eighth gate lines refer to the first to eighth gate lines along the direction of scanning data line in FIG. 1. As shown in FIG. 2, SW1 and SW2 are (DC) high level and low level respectively. Here, all of the first control switches are switched on, all of the second control switches are switched off, and each row of gate lines are turned on and turned off sequentially. Referring to FIG. 2, sequential turn-on and turn-off of the gate lines in the embodiment of the present disclosure may be that another row of gate lines are turned on after one row of gate lines are turned on, and another row of gate lines are turned off after one row of gate lines are turned off, and the turn-on periods of time for two rows of gate lines may partially overlap. Taking FIG. 2 as an example, there is a partial overlap between the turn-on periods of time for Gate1 and Gate2 in the high-resolution area, which achieves the pre-charge of Gate2 and ensures good picture display performance.

Figure 3:
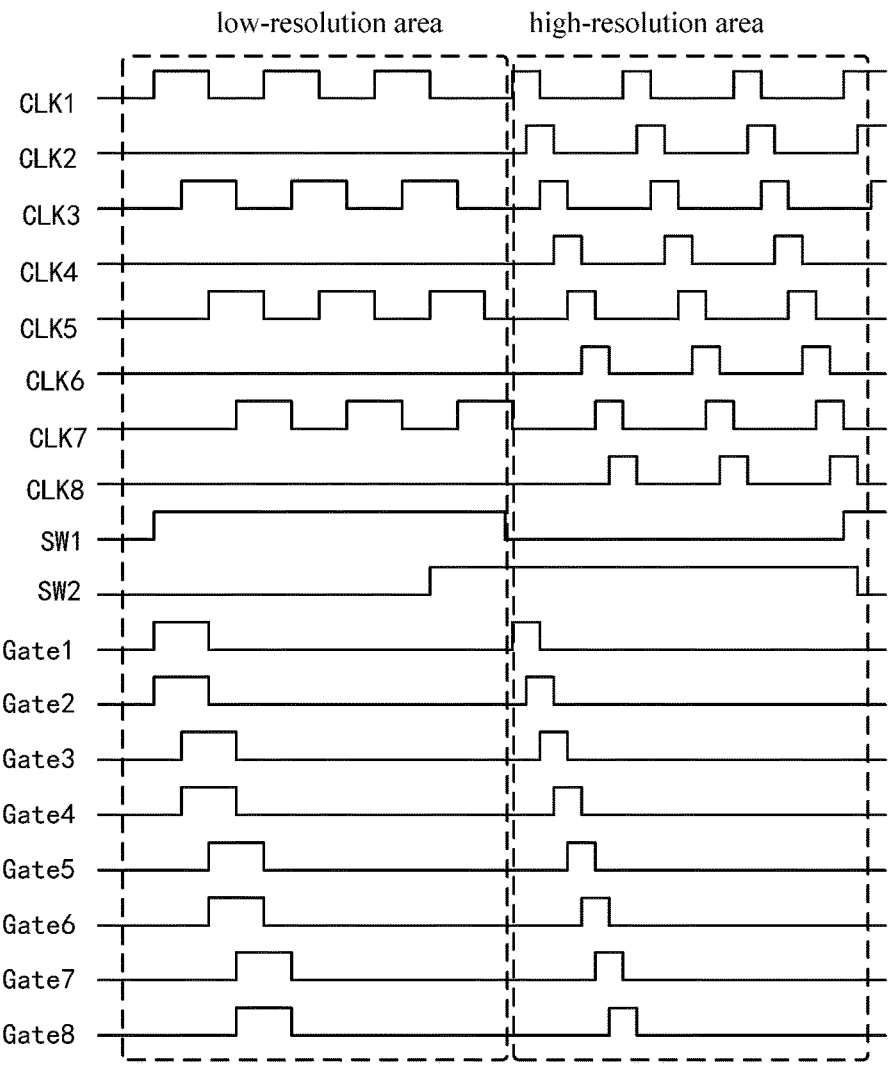
FIG. 3 is another timing control diagram provided in an embodiment of the present disclosure.

FIG. 3 is a timing control diagram in the first display mode. As shown in FIG. 3, in the low-resolution area, CLK2, CLK4, CLK6, and CLK8 remain at a low level so that GOA circuit 2, GOA circuit 4, GOA circuit 6 and GOA circuit 8 in FIG. 1 do not output. Accordingly, SW2 is at a low level and the second control switch is switched off. In the low-resolution area, the waveforms of CLK1, CLK3, CLK5 and CLK7 are the same and there is phase differences so that GOA circuit 1, GOA circuit 3, GOA circuit 5 and GOA circuit 7 sequentially output. SW1 is at a high level and the first control switch is switched on. Gate1 and Gate2 are connected. Gate3 and Gate4 are connected. Gate5 and Gate6 are connected. Gate7 and Gate8 are connected. Here, GOA circuit 1 outputs a signal to Gate1 and Gate2 at the same time. GOA circuit 3 outputs a signal to Gate3 and Gate4 at the same time. GOA circuit 5 outputs a signal to Gate5 and Gate6 at the same time. GOA circuit 7 outputs a signal to Gate7 and Gate8 simultaneously. Therefore, the signal waveforms of Gate1 and Gate2 are the same. The signal waveforms of Gate3 and Gate4 are the same. The signal waveforms of Gate5 and Gate6 are the same. The signal waveforms of Gate7 and Gate8 are the same.

With continued reference to FIG. 3, in the high-resolution area, CLK1~CLK8 have the same waveform and there are phase differences. SW1 is at a low level (the first control switch is switched off) and SW2 is at a high level (the second control switch is switched on) to ensure that gate lines Gate1~Gate8 are turned on successively.

In the low-resolution area, turn-on and turn-off of the gate lines group by group may be a next group of gate lines are turned on after a first group of gate lines are turned on, and the next group of gate lines are turned off after the first group of gate lines are turned off. In addition, there is a partial overlap between the turn-on periods of time for the two groups of gate lines. Taking FIG. 3 as an example, there is a partial overlap between the turn-on periods of time for the first group of gate lines Gate1 and Gate2 and the next group of gate lines Gate3 and Gate4 in the low-resolution area.

It should be noted that the display time of a frame is fixed, that is, the total duration for scanning all the gate lines is constant. In the low-resolution area, the same group of gate lines are turned on or off in synchronism. With respect to the high-resolution area, the number of periods of the corresponding clock signal decreases, the period becomes longer, and the duration of the high level in each period becomes longer. For example, in FIG. 3, the high-level duration of the square wave signal in the low-resolution area is longer than the high-level duration of the square wave signal in the high-resolution area.

In at least one embodiment of the present disclosure, when two consecutive areas along the direction of scanning data line are a low-resolution area and a high-resolution area in sequence, the controller is further configured to: control the second control switch connected to the first gate line to be switched off when the first gate line in the low-resolution area is scanned, and control a second control switch connected to the second gate line to switched on when the second gate line in the low-resolution area is scanned. The output of the shift register circuit connected to the corresponding second gate line is the input of the shift register circuit in the high-resolution area. The first gate line is a gate line other than the second gate line. During the gate driving process, each shift register circuit has a start signal. In the data line scanning direction, the shift register circuit located behind can may adopt the output of the previous shift register circuit as a start signal. The shift register circuit at the initial position along the direction of scanning data line needs to use the STV as the start signal. In the foregoing solutions of the present disclosure, when two consecutive areas in the direction of scanning data line are a low-resolution area and a high-resolution area, one column of shift register circuits in the low-resolution area do not operate, and therefore the STV needs to be provided when the shift register circuits in the high-resolution area operate. With this solution, the last plurality of second control switches in the low-resolution area are switched on so that the shift register circuit connected to the second control switch can output the signal in the connected gate line to the shift register circuit in the high-resolution area. The shift register circuit takes this signal as its initial signal, and thus the STV does not need to be provided as an initial signal again.

That is, since the second shift register circuit does not operate when a gate line in the low-resolution area is scanned, the second shift register circuit corresponding to the gate line in the high-resolution area needs to be provided with a STV when scanning is performed from the low-resolution area to the high-resolution area. With this solution, the second control switches connected to the last plurality of gate lines in the low-resolution area (the gate lines corresponding to the next stage of shift register circuit of the second shift register circuit corresponding to these gate lines are located in the high-resolution area, that is, the second gate line) are switched on, so that signals on the gate lines connected to the second control switches that are switched on may be outputted to the next stage of second shift register circuit as a start signal thereof. Thus, the second shift register circuit corresponding to the high-resolution area does not need to be provided with a STV as a start signal thereof.

Referring again to FIG. 3, when scanning is performed from the low-resolution area to the high-resolution area, SW1 is switched from a high level to a low level while SW2 is switched from a low level to a high level when the last part of the low-resolution area is scanned to control the last part of gate lines in the low-resolution area to be turned on. Thus, no STV is needed. For example, assuming that in the structure shown in FIG. 1, the $1^{st}$ to the $8^{th}$ gate lines belong to the low-resolution area, the 9$^{th}$ to the 16$^{th}$ gate lines belong to the high-resolution area, and the 17$^{th}$ to 27$^{th}$ gate lines belong to the low-resolution area, then during control, the second control switches 102 connected to GOA circuit 2 and GOA circuit 4 may be controlled to be switched off, and the second control switches 102 connected to GOA circuit 6 and GOA circuit 8 may be controlled to be switched on, so that the output of GOA circuit 6 and GOA circuit 8 may provide input to GOA circuit 10 and GOA circuit 12, GOA circuit 10 and GOA circuit 12 output signals when the clock signal is at a high level, and no STV signal needs to be used as an input.

In at least one embodiment of the present disclosure, each first control switch is connected to one end of the corresponding gate line close to the first shift register circuit. As shown in FIG. 1, each the first control switch 101 is disposed near one end of the first shift register circuit, that is, near the left side. The first control switch is disposed at an end of the gate line close to the first shift register circuit, which ensures that the output of the shift register circuit can be transmitted to two gate lines in time.

In at least one embodiment of the present disclosure, each second control switch is connected to one end of the corresponding gate line close to the second shift register circuit. As shown in FIG. 1, each second control switch 102 is disposed near one end of the second shift register circuit, that is, near the right side. The second control switch is disposed at one end of the gate line close to the second shift register circuit, which ensures that the signal of the shift register circuit connected to the second control switch will not be outputted to the gate line when the second control switch is switched off.

In at least one embodiment of the present disclosure, the extending directions of the first control line and the second control line are arranged along the data line scanning direction, that is, the same direction as the data line extending direction. Referring to FIG. 1, the extending directions of the first control line SW1 and the second control line SW2 are arranged to be perpendicular to the gate line, which facilitates the arrangement and connection of the control lines.

Figure 4:
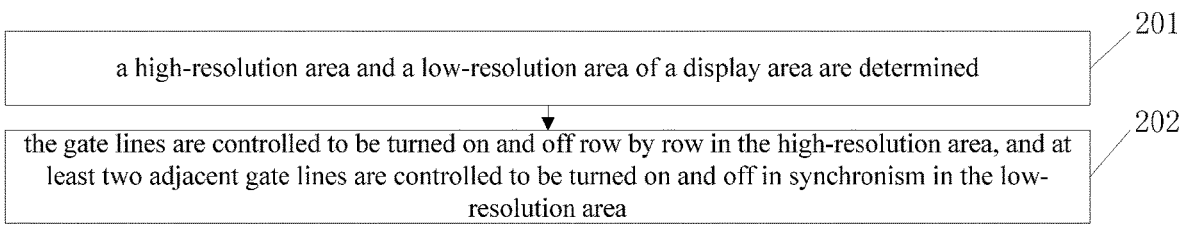
FIG. 4 is a flow chart of a gate line driving method provided in an embodiment of the present disclosure.

FIG. 4 is a flow chart of a gate line driving method according to an embodiment of the present disclosure. Referring to FIG. 4, the method is implemented using the foregoing shift register, and the method includes the following steps.

In step 201: a high-resolution area and a low-resolution area of a display area are determined.

Exemplarily, step 201 may include: acquiring a drive signal, and determining the high-resolution area and the low-resolution area of the display area based on the drive signal. The drive signal may be implemented in various methods. For example, the drive signal may be a timing signal indicating the high-resolution area and the low-resolution area through high and low levels. For example, during the scanning of one frame, the timing signal includes a low level segment, a high level segment and a low level segment set consecutively. According to the length and position of the high level segment in the timing signal, the duration and position of the high-resolution display during the process of displaying one frame may be determined to further determine the high-resolution area and low-resolution area in the display area.

The method may further include: receiving a resolution switching command, and switching a display mode when the resolution switching command is received. The display mode may include the foregoing first display mode and second display mode.

In step 202, the gate lines are controlled to be turned on and off row by row in the high-resolution area, and at least two adjacent gate lines are controlled to be turned on and off in synchronism in the low-resolution area.

In this embodiment, in the low-resolution area, the gate lines are controlled to be turned on and off group by group. Each group of gate lines include at least two gate lines, and gate lines in the same group are turned on and off in synchronism.

The control of the turn-on and turn-off of the gate lines includes the control of the timing of the control switches and the shift register circuits, which may be referenced to the description above for details.

In the embodiments of the present disclosure, the gate lines are controlled to be turned on and off row by row in the high-resolution area, and at least two adjacent gate lines are controlled to be turned on and off in synchronism in the low-resolution area. In this way, each gate line in the high-resolution area works independently to ensure high resolution. When the low-resolution area is displayed, at least two gate lines are scanned at the same time. A source driver writes the same data signal to the at least two gate lines to reduce changes in the data signal and decrease the power consumption of the source driver. Finally, the high-resolution display panel can be divided into a high-resolution area and a low-resolution area. The low power consumption of the low-resolution area reduces the overall power consumption of the display panel, and solves the problem that the power consumption in the existing high-resolution display panels increases dramatically due to the increase in the number of scanning rows.

The embodiments of the present disclosure further provide an array substrate. The array substrate includes the shift register described above.

In the embodiment of the present disclosure, the gate lines are controlled to be turned on and off row by row in the high-resolution area, and at least two adjacent gate lines are controlled to be turned on and off in synchronism in the low-resolution area. In this way, each gate line in the high-resolution area works independently to ensure high resolution. When the low-resolution area is displayed, at least two gate lines are scanned at the same time. A source driver writes the same data signal to the at least two gate lines to reduce changes in the data signal and decrease the power consumption of the source driver. Finally, the high-resolution display panel can be divided into a high-resolution area and a low-resolution area. The low power consumption of the low-resolution area reduces the overall power consumption of the display panel, and solves the problem that the power consumption in the existing high-resolution display panels increases dramatically due to the increase in the number of scanning rows.

The embodiments of the present disclosure further provide a display device. The display device includes the array substrate described above.

During implementation, the display device provided in the embodiments of the present disclosure may be a mobile phone, a tablet computer, a television, a display, a laptop computer, a digital photo frame, a navigator and any other product or part having a display function.

In the embodiment of the present disclosure, the gate lines are controlled to be turned on and off row by row in the high-resolution area, and at least two adjacent gate lines are controlled to be turned on and off in synchronism in the low-resolution area. In this way, each gate line in the high-resolution area works independently to ensure high resolution. When the low-resolution area is displayed, at least two gate lines are scanned at the same time. A source driver writes the same data signal to the at least two gate lines to reduce changes in the data signal and decrease the power consumption of the source driver. Finally, the high-resolution display panel can be divided into a high-resolution area and a low-resolution area. The low power consumption of the low-resolution area reduces the overall power consumption of the display panel, and solves the problem that the power consumption in the existing high-resolution display panels increases dramatically due to the increase in the number of scanning rows.

The foregoing are only some embodiments of the present disclosure, and are not intended to limit the present disclosure. Within the spirit and principles of the disclosure, any modifications, equivalent substitutions, improvements, etc., are within the scope of protection of the present disclosure.

What is claimed is:

1. A shift register, comprising:
    a plurality of shift register circuits arranged in a one-to-one correspondence with gate lines on an array substrate; and
    a control circuit configured to control signals output from the shift register circuits to the gate lines, to control each row of gate lines to be turned on and off, so that a display area has a high-resolution area and a low-resolution area, wherein a resolution of the low-resolution area is smaller than that of the high-resolution area;
    wherein in the high-resolution area, the control circuit controls the gate lines to be turned on and off row by row; and in the low-resolution area, the control circuit controls the gate lines to be turned on and off group by group, each group of gate lines including at least two adjacent gate lines, and gate lines in the same group being turned on and off synchronously;
    wherein the plurality of shift register circuits are divided into a plurality of groups, each group of shift register circuits are arranged to correspond to at least two consecutive gate lines, each group of shift register circuits comprise a first shift register circuit and at least one second shift register circuit, the first shift register circuit is directly connected to a corresponding gate line, and the second shift register circuit is connected to a corresponding gate line through the control circuit;
    wherein the control circuit comprises a plurality of groups of first control switches and a plurality of second control switches, each group of first control switches comprise at least one control switch, gate lines corresponding to each group of shift register circuits are connected successively using one group of the first control switches, and each second shift register circuit is connected to the corresponding gate line through one second control switch respectively, and
    the first control switch is configured to be switched off when the gate line corresponding thereto is located in the high-resolution area and scanned, and switched on when the gate line corresponding thereto is located in the low-resolution area and scanned; and the second control switch is configured to be switched on when the gate line corresponding thereto is located in the high-resolution area and scanned;
    wherein when two consecutive areas in a direction of scanning data line are sequentially the low-resolution area and the high-resolution area, the second control switch is configured to be switched off when a first gate line in the low-resolution area is scanned, and switched on when a second gate line in the low-resolution area is scanned, and a next stage of shift register circuit of the second shift register circuit corresponding to the second gate line is a second shift register circuit corresponding to a gate line in the high-resolution area, and the first gate line is a gate line in the low-resolution area other than the second gate line; and
    wherein the shift register further comprises a first control line and a second control line, wherein the first control line is connected to control terminals of the plurality of groups of first control switches, and the second control line is connected to control terminals of the plurality of second control switches.

2. The shift register according to claim 1, wherein each group of shift register circuits have the same number of shift register circuits.

3. The shift register according to claim 1, wherein each group of shift register circuits comprise one first shift register circuit and one second shift register circuit, or each group of shift register circuits comprise one first shift register circuit and two second shift register circuits.

4. The shift register according to claim 1, wherein the first control line and the second control line extend in the same direction as the direction of scanning data line.

5. The shift register according to claim 1, wherein the first shift register circuit and the second shift register circuit are disposed on both sides of the display area.

6. The shift register according to claim 1, wherein all of the first control switches are connected to one end of the corresponding gate line close to the first shift register circuit.

7. The shift register according to claim 1, wherein all of the second control switches are connected to one end of the corresponding gate line close to the second shift register circuit.

8. The shift register according to claim 1, further comprising a clock signal line configured to output a low level signal to the second shift register circuit corresponding to the gate line in the low-resolution area when a gate line in the low-resolution area is scanned.

9. The shift register according to claim 1, wherein in the direction of scanning data line, the turn-on periods of time for any two adjacent rows of gate lines partially overlap; and in the direction of scanning data line, the turn-on periods of time for any two adjacent groups of gate lines partially overlap.

10. An array substrate, comprising a shift register according to claim 1.

11. A display device comprising an array substrate according to claim 10.

12. A gate line driving method implemented by a shift register comprising:
    a plurality of shift register circuits arranged in a one-to-one correspondence with gate lines on an array substrate; and
    a controller configured to control signals output from the shift register circuits to the gate lines, to control each row of gate lines to be turned on and off, so that a display area has a high-resolution area and a low-resolution area, wherein a resolution of the low-resolution area is smaller than that of the high-resolution area;
    wherein in the high-resolution area, the controller controls the gate lines to be turned on and off row by row; and in the low-resolution area, the controller controls the gate lines to be turned on and off group by group, each group of gate lines including at least two adjacent gate lines, and gate lines in the same group being turned on and off synchronously, the method comprising:

determining the high-resolution area and the low-resolution area of the display area; and in the high-resolution area, controlling the gate lines to be turned on and off row by row; and in the low-resolution area, controlling the gate lines to be turned on and off group by group;

wherein the plurality of shift register circuits are divided into a plurality of groups, each group of shift register circuits are arranged to correspond to at least two consecutive gate lines, each group of shift register circuits comprise a first shift register circuit and at least one second shift register circuit, the first shift register circuit is directly connected to a corresponding gate line, and the second shift register circuit is connected to a corresponding gate line through the control circuit;

wherein the control circuit comprises a plurality of groups of first control switches and a plurality of second control switches, each group of first control switches comprise at least one control switch, gate lines corresponding to each group of shift register circuits are connected successively using one group of the first control switches, and each second shift register circuit is connected to the corresponding gate line through one second control switch respectively, and the first control switch is configured to be switched off when the gate line corresponding thereto is located in the high-resolution area and scanned, and switched on when the gate line corresponding thereto is located in the low-resolution area and scanned; and the second control switch is configured to be switched on when the gate line corresponding thereto is located in the high-resolution area and scanned;

wherein when two consecutive areas in a direction of scanning data line are sequentially the low-resolution area and the high-resolution area, the second control switch is configured to be switched off when a first gate line in the low-resolution area is scanned, and switched on when a second gate line in the low-resolution area is scanned, and a next stage of shift register circuit of the second shift register circuit corresponding to the second gate line is a second shift register circuit corresponding to a gate line in the high-resolution area, and the first gate line is a gate line in the low-resolution area other than the second gate line; and wherein the shift register further comprises a first control line and a second control line, wherein the first control line is connected to control terminals of the plurality of groups of first control switches, and the second control line is connected to control terminals of the plurality of second control switches.

13. The gate line driving method according to claim 12, further comprising:

outputting a low-level signal to a second shift register circuit corresponding to a gate line in the low-resolution area when the gate line in the low-resolution area is scanned, wherein the second shift register circuit is a shift register connected to the corresponding gate line through the controller in the plurality of shift register circuits.

* * * * *